United States Patent
Guo

(12) 
(10) Patent No.: US 6,876,104 B1
(45) Date of Patent: Apr. 5, 2005

(54) HIGH-SPEED SWITCHING CIRCUIT AND AUTOMOTIVE ACCESSORY CONTROLLER USING SAME

(75) Inventor: Sam Y. Guo, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 302 days.

(21) Appl. No.: 09/995,033

(22) Filed: Nov. 27, 2001

(51) Int. Cl.⁷ ............................................. H01H 3/26
(52) U.S. Cl. .................. 307/140; 307/125; 307/131; 307/9.1; 307/10.1; 307/412
(58) Field of Search .................. 307/125, 131, 307/140, 9.1, 10.1, 10.8, 412

(56) References Cited

U.S. PATENT DOCUMENTS

| | | | |
|---|---|---|---|
| 4,070,641 A | 1/1978 | Khalid | |
| 5,457,364 A | * 10/1995 | Bilotti et al. | 318/434 |
| 5,612,660 A | 3/1997 | Takimoto | |
| 5,914,545 A | * 6/1999 | Pollersbeck | 307/131 |
| 6,011,416 A | * 1/2000 | Mizuno et al. | 327/108 |
| 6,031,445 A | 2/2000 | Marty et al. | |
| 6,194,990 B1 | * 2/2001 | Lee et al. | 338/320 |

* cited by examiner

Primary Examiner—Robert L. DeBeradinis
(74) Attorney, Agent, or Firm—Young & Basile, P.C.

(57) ABSTRACT

A high-speed switching circuit with a low or zero inductance shunt resistor is constructed using a trace resistor having parallel overlying trace portions on opposite plane faces of a printed circuit board. The resulting shunt resistor is used in combination with a detector to input data to a microcontroller which controls an automotive load device such as a blower motor. The traces which form the resistor may be extended by horizontal or vertical zig-zag folding or a combination of the two.

11 Claims, 3 Drawing Sheets

HIGH-SPEED SWITCHING CIRCUIT AND AUTOMOTIVE ACCESSORY CONTROLLER USING SAME

FIELD OF THE INVENTION

This invention relates to switching circuits and more particularly to a switching circuit using a shunt resistor for current sensing made up of overlying, opposite-direction traces on opposite sides of a printed circuit board such that the shunt resistor is essentially inductance free. The invention is advantageously applied to an automotive accessory control circuit using pulse width modulation (PWM).

BACKGROUND OF THE INVENTION

It is known to use low ohmage shunt resistors to measure current through a load. The resistor is connected in series with the load such that the voltage across the resistor represents load current. This voltage can be used as an input to a detector circuit to determine when measured current rises above or falls below some decision point value.

A problem arises where it is essential to detect and respond to current changes very quickly. Resistors of traditional construction have both body and lead inductance, a characteristic which generates voltage due to a signal with a high di/dt value. For example, a ten-milliohm resistor may have about 4nH inductance. If current drops from 16 amps to 0 within a 75 nanosecond switch-off time, the inductance-induced spike voltage is 850 millivolts, more than 5 times larger than the useful voltage drop across the shunt resistor. Therefore, it may be impossible to detect and respond to rapid current changes using control circuits with conventional shunt resistors.

The problem described above becomes especially acute if pulse width modulation is used to control the magnitude of the load current. PWM techniques are characterized by frequent and rapid transitions in current; i.e., high di/dt factors.

SUMMARY OF THE INVENTION

In accordance with the present invention a current-measuring control circuit is provided with a shunt resistor having little or no net inductance thereby to accommodate high di/dt values associated with PWM techniques without the normal tendency to develop a high fault voltage due to the inductive component of the resistor. In general this is accomplished by providing a shunt resistor made up of traces disposed in overlying relationship on opposite parallel faces of a printed circuit board, interconnecting the two traces at one end to form a continuous resistive path in which current flows in opposite directions in the overlying parallel traces and using the trace resistor as a shunt resistor input to a detector circuit such as a comparator or an operational amplifier. As a result the detector immediately sees the true voltage change rather than an inductance induced voltage spike which might be erroneously interpreted as a short circuit or other fault condition.

In a specific application hereinafter described, the output of the detector circuit is connected to provide input data to a programmable device such as a microcontroller to control the state of an FET switch which in turn controls the application of current to an automotive accessory such as a blower motor.

As hereinafter described, higher shunt resistor values can be achieved by extending the overlying traces across a single layer of insulative board, by increasing the number of trace layers, or by a combination of these techniques.

Other applications of the present invention will become apparent to those skilled in the art when the following description of the best modes contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
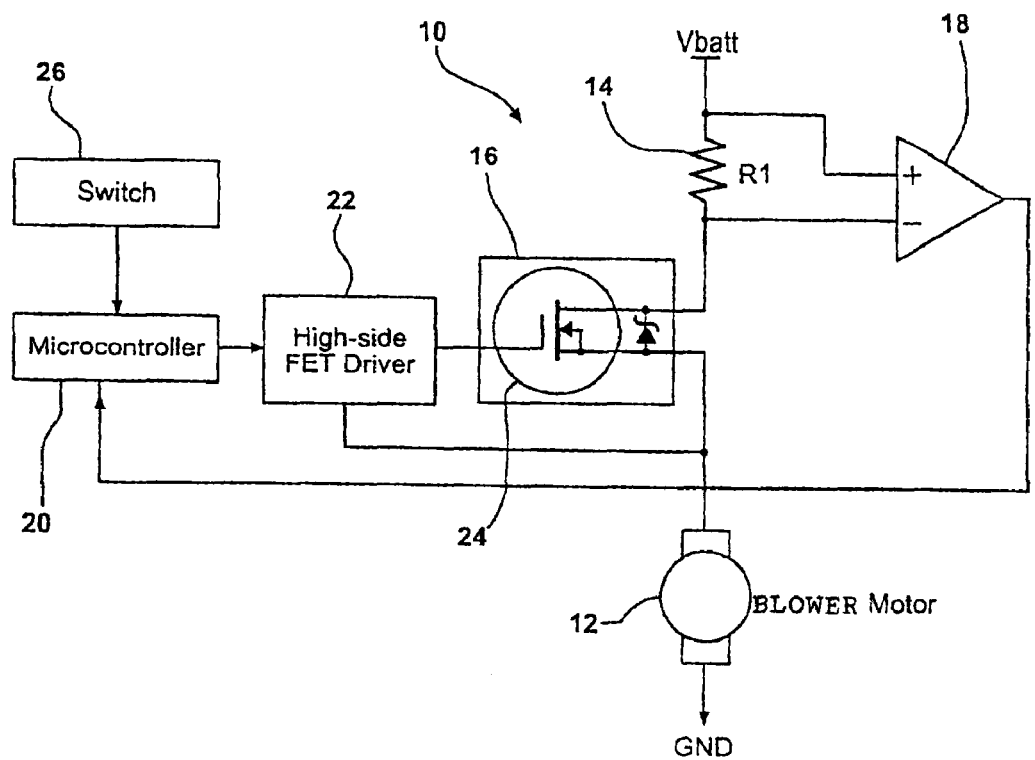
FIG. 1 is a circuit diagram of an automotive accessory control circuit using a shunt resistor and a detector circuit as an input to a microcontroller to determine the conductive state of an FET switch operating in a PWM mode.

FIG. 1 shows a control circuit 10 for an automotive accessory load circuit which, in this case, includes a blower motor 12. The blower motor 12 is connected in series with a shunt resistor 14 and an FET switch 16 operating in a pulse width modulation (PWM) mode to supply current to motor 12 from a dc supply labeled battery Vbatt.

The opposite terminal ends of the shunt resistor 14 are connected as opposite polarity inputs to a detector circuit 18 such as a comparator or operational amplifier. The output of the detector 18 goes high if the measured voltage across the shunt resistor 14 exceeds a predetermined threshold value associated with, for example, high motor current due to an intake obstacle, overload or short circuit of the blower motor.

The detector output is connected as a data input to a micro-controller 20 which, in turn, controls a high side PET driver circuit 22. The output of the driver circuit is connected to the switching terminal of an FET 24 in circuit 16.

Microcontroller 20 normally controls the duty cycle of the FET driver to provide 12 volts to the blower motor 12 whenever a blower switch 26 commands this condition.

If the motor current remains within normal limits, the FET 24 cycles in a normal fashion. If a fault condition exists, a rapid rise in voltage across resistor 14 exceeds the threshold of amplifier 18 and signals the microcontroller 20 to shut the FET 24 off.

Figure 2:
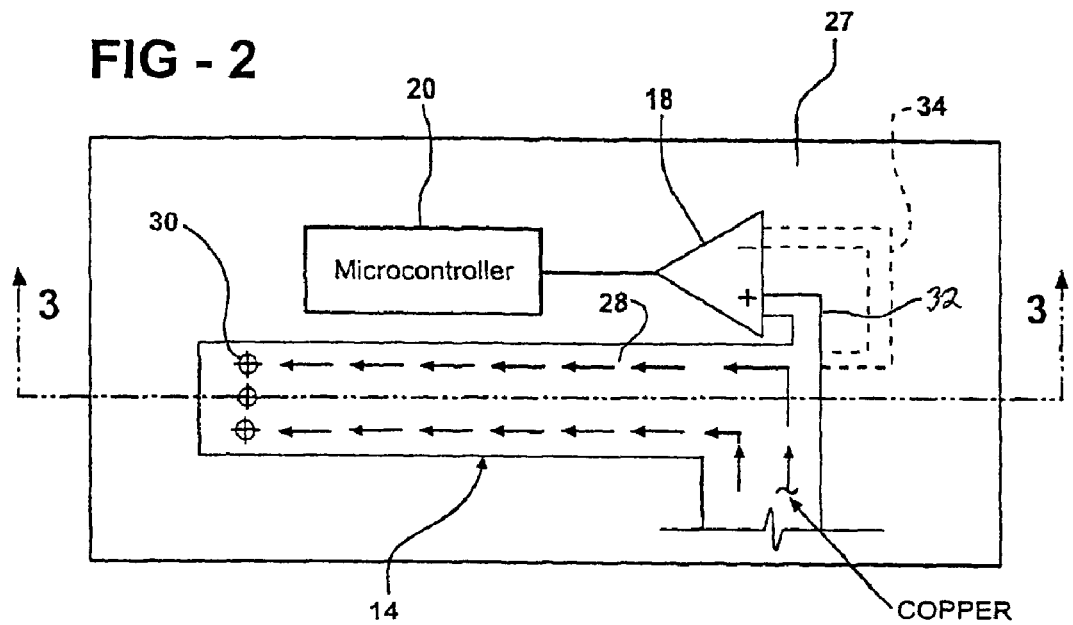
FIG. 2 is a plan view of the microcontroller, detector and shunt resistor portion of the circuit of FIG. 1, indicating how the trace resistor is disposed on a printed circuit board.
Figure 3:
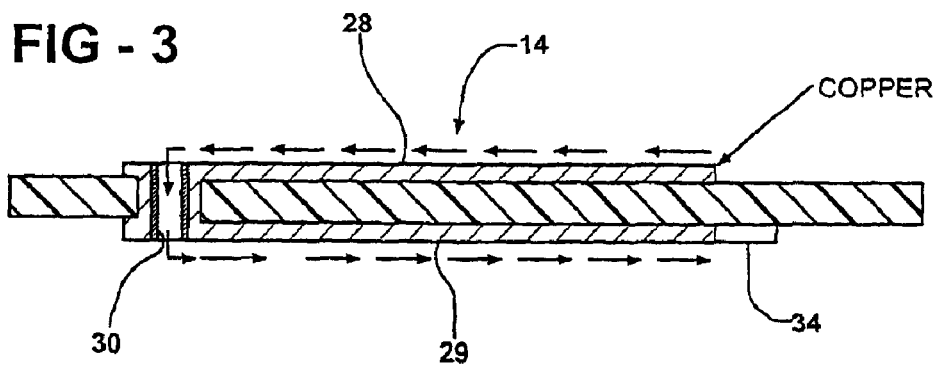
FIG 3. is a side view of the resistor element of FIG. 2.

Looking to FIGS. 2 and 3, the microcontroller 20 is mounted along with the detector circuit 18 on a conventional insulative printed circuit board 27. In the circuit of FIGS. 2 and 3, the shunt resistor 14 is made up of top trace 28 on one side of the printed circuit board 27 and a bottom trace 29 on the other side of the printed circuit board 27. The traces 28 and 29 are essentially linear and overlie one another. Vias 30 interconnect the top and bottom traces 28 and 29 at the left end as seen in FIGS. 2 and 3 to form a continuous, low ohmage current path A leg 32 of the top trace 28 is connected to the positive input of the detector circuit 18 and a leg 34 of the bottom trace 29 is connected to the negative input of the detector circuit 18. Accordingly the detector circuit sees the voltage drop across the series combination of the top and bottom traces when they are connected as a shunt resistor 14 as shown in FIG. 1. The thickness of the traces and board are exaggerated for clarity.

With the construction shown in FIGS. 2 and 3 the current flowing in the top trace 28 produces an inductive field which exactly cancels the inductive field produced by current flowing in the opposite direction in the bottom trace 29 as indicated in FIG. 3. The result is an essentially inductance free shunt resistor 14 which is capable of accurately following the true currents with high di/dt values.

Figure 4:
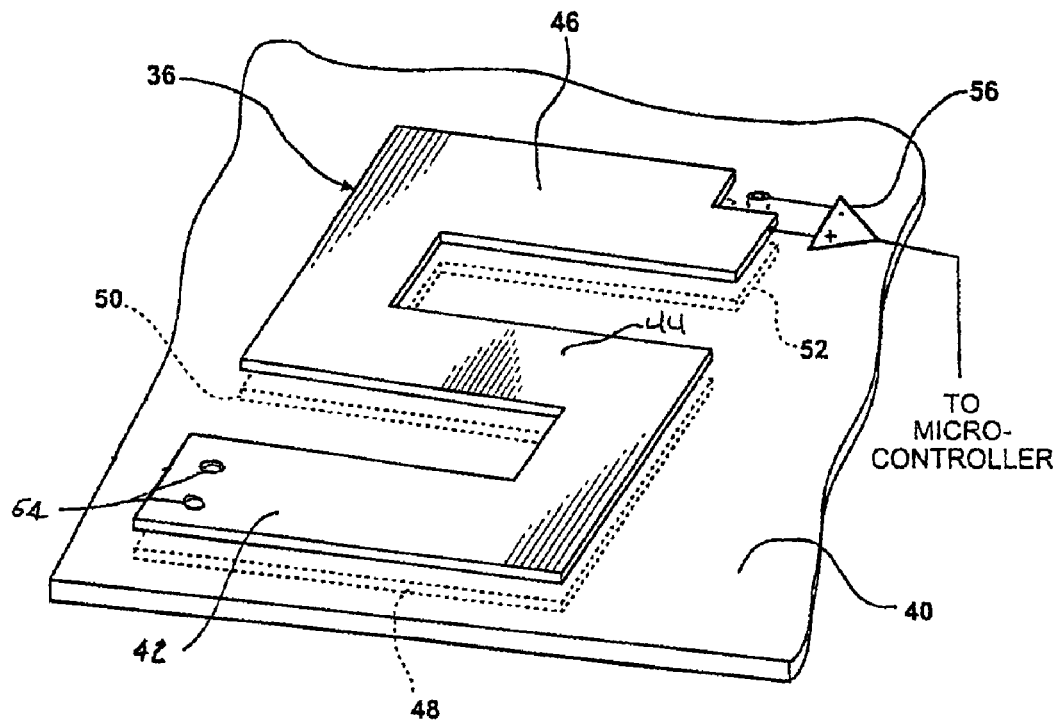
FIG. 4 is a perspective view of an extended trace on a double layer circuit board.

FIG. 4 shows one way a trace-formed shunt resistor 36 for a detector circuit 56 can be extended over the opposite surfaces of an insulator board 40 to achieve higher resistance values. Again, thicknesses are exaggerated. The top trace is formed in a zig-zag or folded-back form with parallel legs 42, 44 and 46. The bottom trace is similarly layed out to form legs 48, 50 and 52 which underlie the top trace legs 42, 44 and 46, respectively. Vias 54 interconnect the top and bottom traces to form a continuous resistor which is effectively six trace lengths long. Again, current flows in the overlying top and bottom legs opposite one another to substantially cancel inductance. A detector circuit 56 is connected across the traces as shown and provides data to microcontroller 20 as described above with reference to FIG. 1.

Figure 5:
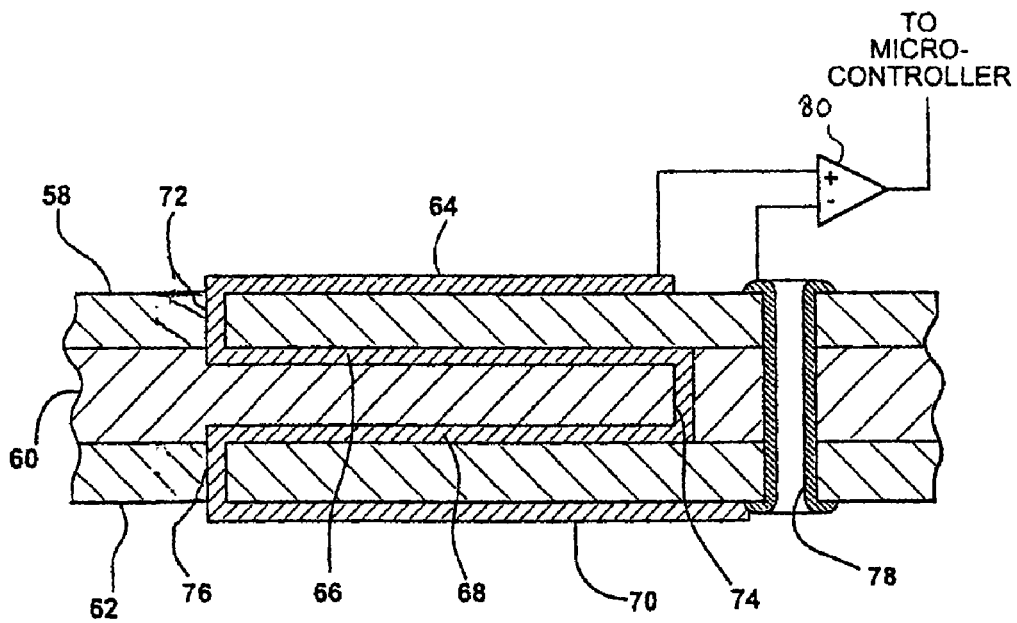
FIG. 5 is a sectional view of a trace which is extended by multiple circuit board layers.

FIG. 5 shows another way to extend overlying traces. In this arrangement three layers 58, 60 and 62 of insulative PCB board are adhesively bonded together. A continuous trace made up of top leg 64, intermediate legs 66 and 68, and bottom leg 70 forms a shunt resistor. The legs all overlie one another. Top leg 64 extends through blind via 72 to leg 66; leg 66 extends through buried via 74 to leg 68; leg 68 extends through blind via 76 to leg 70. A copper throughhole via 78 brings the bottom leg 70 back to the top of board 58 so that opposite ends of the trace resistor can be connected to detector 80 as shown. The arrangement of FIG. 5 is, of course, used in the circuit of FIG. 1 wherein the trace legs 64, 66, 68 and 70 form the shunt resistor 14 and amplifier 80 corresponds to amplifier 18.

The techniques of FIGS. 4 and 5 can be used together.

It will be apparent to those skilled in the art that the printed circuit board 27 may carry a number of FETs and FET drivers as well as other components for the control of multiple loads such as lamps, fuel injectors, window motors, air-conditioning systems and the like. The microcontroller is typically separately constructed and attached to the printed circuit board by way of soldered or brazed leads. The overall board may make up a node in an automotive electrical system using nodular architecture.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A fast response pulse width modulated control circuit comprising:

an electronic switch device having an output circuit and an input circuit, a milliohmic shunt resistor connected in series with the output circuit;

a detector having an input circuit connected across the shunt resistor and an output which changes state according to changes in voltages developed across the shunt resistor;

means connected to the output of the detector to control the switch device to vary the duty cycle thereof;

said shunt resistor comprising a dielectric support with first and second conductive traces printed in overlying parallel relationship on opposite faces thereof and a via through the support and electrically interconnecting the traces at one end thereof such that load current flows in opposite directions through the first and second traces.

2. An automotive accessory control circuit comprising an FET switch and a shunt resistor connected in series between a power supply and a drive motor;

a detector having inputs connected across the shunt resistor and an output which changes state in accordance with voltages developed across the shunt resistor;

a microcontroller having an input connected to receive the output of the detector and being programmed to provide an output which changes state in accordance with a change in state of the detector output; and a FET driver connected to receive the output of the microcontroller for varying the duty cycle of the FET switch;

wherein said shunt resistor comprises a dielectric support with first and second conductive traces printed in overlying parallel relationship on opposite faces thereof and an electrical connector extending through the support and electrically connecting the traces at one end thereof.

3. A circuit as defined in claim 2 wherein the first and second traces have multiple legs on each of said faces.

4. A circuit as defined in claim 2 wherein shunt resistor comprises third and forth traces electrically continuous with the first and second traces.

5. A circuit as defined in claim 2 wherein the detector is an amplifier.

6. A circuit as defined in claim 2 wherein the detector is a comparator.

7. A control circuit comprising:

a pulse width modulated solid state power switch for connecting a DC power supply to a DC load device;

a shunt resistor connected in series with the switch;

a detector having inputs connected across the resistor for detecting the voltage drop across the resistor and producing an output related thereto;

a control circuit for varying the duty cycle of the switch and having an input connected to receive the output of the detector; and a circuit board having opposite parallel surfaces; said shunt resistor comprising first and second overlying traces on said opposite circuit board surfaces and further including a conductive interconnection through said circuit board to connect the traces in series.

8. A circuit as defined in claim 7 wherein the detector is a comparator.

9. A circuit as defined in claim 7 wherein the detector is an electronic amplifier mounted on said circuit board.

10. A circuit as defined in claim 7 wherein the first and second traces have multiple legs on each of said faces.

11. A circuit as defined in claim 7 wherein the shunt resistor comprises third and forth traces electrically continuous with the first and second traces.

* * * * *